United States Patent
Boehm et al.

(10) Patent No.: US 7,744,718 B2
(45) Date of Patent: Jun. 29, 2010

(54) MICROSYSTEM COMPONENT AND METHOD FOR GLUING MICROCOMPONENTS TO A SUBSTRATE

(75) Inventors: Stefan Boehm, Alsdorf (DE); Klaus Dilger, Braunschweig (DE); Elisabeth Stammen, Langerwehe (DE); Frank Mund, Duesseldorf (DE); Gero Pokar, Braunschweig (DE); Jan Wrege, Wolfenbuettel (DE)

(73) Assignee: Technische Universitaet Braunschweig Carolo-Wilhelmina, Braunschweig (DE)

( * ) Notice: Subject to any disclaimer, the term of this patent is extended or adjusted under 35 U.S.C. 154(b) by 340 days.

(21) Appl. No.: 10/568,755

(22) PCT Filed: Aug. 6, 2004

(86) PCT No.: PCT/DE2004/001770

§ 371 (c)(1),
(2), (4) Date: Feb. 21, 2006

(87) PCT Pub. No.: WO2005/021669

PCT Pub. Date: Mar. 10, 2005

(65) Prior Publication Data

US 2006/0243380 A1 Nov. 2, 2006

(30) Foreign Application Priority Data

Aug. 25, 2003 (DE) ................................ 103 38 967

(51) Int. Cl.
*B32B 37/00* (2006.01)

(52) U.S. Cl. .............. 156/272.8; 156/275.1; 156/273.1; 156/283; 156/322

(58) Field of Classification Search .............. 156/272.8, 156/275.1, 272.2, 273.1, 274.4, 277, 283, 156/290, 291, 320, 322; 427/98.4, 282, 474, 427/207.1, 208.2; 438/118, 455
See application file for complete search history.

(56) References Cited

U.S. PATENT DOCUMENTS

| 2,947,625 | A | * | 8/1960 | Bertelsen | 430/120.2 |
| 3,419,409 | A | * | 12/1968 | Dettling | 427/185 |
| 3,662,395 | A | * | 5/1972 | Doi et al. | 347/153 |
| 3,922,418 | A | * | 11/1975 | Lauchenauer | 428/196 |
| 4,183,978 | A | * | 1/1980 | Hefele | 427/202 |
| 4,710,253 | A | * | 12/1987 | Soszek | 156/272.8 |

(Continued)

FOREIGN PATENT DOCUMENTS

DE 3508114 C * 5/1986

(Continued)

OTHER PUBLICATIONS

Machine Translation of DE 3739333 A1, Jun. 25, 2009.*

*Primary Examiner*—John L Goff
*Assistant Examiner*—Daniel McNally
(74) *Attorney, Agent, or Firm*—Whitham Curits Christofferson & Cook, PC (57) ABSTRACT

A method for gluing microcomponents to a substrate (1) during the production of microsystem components includes the steps of applying a reactive or non-reactive hot melt type adhesive (5) to the microcomponent (18) and/or the substrate (1), heating the hot melt type adhesive (5), and placing the microcomponent (18) onto the substrate (1). The hot melt type adhesive (5) is on the contact surfaces between the microcomponent (18) and the substrate (1) during and after gluing.

6 Claims, 12 Drawing Sheets

U.S. PATENT DOCUMENTS

| | | | |
|---|---|---|---|
| 5,356,751 A * | 10/1994 | Cairncross et al. | 430/253 |
| 5,422,146 A * | 6/1995 | Adams | 427/475 |
| 6,099,679 A * | 8/2000 | Karem et al. | 156/273.1 |
| 6,126,765 A * | 10/2000 | Ohman | 156/74 |
| 6,515,048 B1 * | 2/2003 | Kalbe et al. | 523/465 |
| 2003/0029724 A1 * | 2/2003 | Derand et al. | 204/451 |
| 2004/0265504 A1 * | 12/2004 | Magnin et al. | 427/458 |

FOREIGN PATENT DOCUMENTS

| | | |
|---|---|---|
| DE | 3739333 | 11/1987 |
| DE | 3739333 A1 * | 6/1989 |
| DE | 19645000 | 10/1996 |
| DE | 19850041 | 10/1998 |
| DE | 19819054 | 11/1999 |
| NL | 1009420 | 6/1998 |
| WO | WO 98/45693 | 4/1998 |
| WO | WO 02/90454 | 4/2002 |

* cited by examiner

Fig. 12

MICROSYSTEM COMPONENT AND METHOD FOR GLUING MICROCOMPONENTS TO A SUBSTRATE

FIELD OF THE INVENTION

The invention relates to a method for gluing microcomponents to a substrate in the production of microsystem components.

The invention further relates to a microsystem component having at least one microcomponent glued to a substrate.

BACKGROUND OF THE INVENTION

In many cases in microsystems technology, electronic, electromechanical or purely mechanical microcomponents are glued to a substrate. The precision which is needed here, the low bond areas, and the need to automate the joining operation pose a particular problem here. Microcomponents are conventionally glued using viscous adhesives as one- or two-part systems which have a specific potlife within which the adhesion properties are retained and the bonding operation can be implemented. Viscous adhesives, moreover, have a specific cure time which the adhesive needs in order to ensure a stable bond.

Publications U.S. Pat. No. 6,126,765, US 2003/0029724 A1, and WO 98/45693 describe methods of this kind for bonding microstructures using viscous hotmelt adhesives.

The potlife ought to be as long as possible, in order to allow rational joining of microcomponents by extensive application of the adhesive to the substrate, and subsequent joining of a multiplicity of microcomponents to the substrate in a time required for the operation. On the other hand, the pot life and cure time should be as short as possible, so that the adhesive bond cures immediately after the joining operation and the microcomponents are not displaced on the substrate. These two contrary boundary conditions are almost impossible to reconcile with one another. A further complicating factor is the low thickness of the film of adhesive that is required in microsystems technology, in the μm range, which is different from macroscopic bonding.

DE 198 50 041 A1 describes a microtechnological bonding method of producing an adhesive bond using a liquid or pasty hotmelt adhesive which has at least a viscosity such that it can be placed as a string of adhesive with a defined cross section on one of the adherends. The gluing effect is only developed under specific external conditions—heating of the adhesive, for example—so that the string of adhesive can be displaced, owing to the as yet absent or minimal adhesion tendency. However, this may result in the desired bond area being only partly wetted with the required amount of adhesive, which leads to a significant reduction in the quality of the joint.

DE 37 39 333 A1 describes a method of producing hotmelt adhesive bonds that uses a laser as its heat source. The method envisages treating the reverse face of the adherend wafers by coating them with a hotmelt adhesive solution or with an adhesive varnish in a varnish spin-coating unit or laminating them by means of an adhesive sheet, using a sheet ironing unit. The wafers are subsequently sawn in the usual way, and the individualized chips are dried. The chips are then lifted cyclically and simultaneously from the wafer and fixed in pairs using the laser. The energy of the laser beam serves here to melt the adhesive in order to produce the joining of the adherends.

SUMMARY OF THE INVENTION

It is an object of the invention, therefore, to provide an improved method of gluing microcomponents to a substrate for producing microsystem components that allows rational joining of a multiplicity of microcomponents individually in succession or, preferably, in one step and prevents displacement of the microcomponents after they have been applied to the substrate, while taking into account the high precision requirements of microsystems technology.

This object is inventively achieved with the generic method such that pulverulent hotmelt adhesive is applied areally to the surface of the substrate or microcomponent, selected bondsites are incipiently melted by local heating by means of irradiation of the selected bondsites through a focusable heat source, and the powder layer not incipiently melted is removed. This is then followed by the adhesion of the at least one microcomponent to the substrate by application of the microcomponents to the substrate and further heating of the assembly.

Reactive or nonreactive hotmelt adhesives are known in principle from the macro technology. In contradistinction to the viscous adhesives, bonding takes place immediately during cooling, without a cooling time, when the hotmelt adhesive has been heated to above the melting temperature. Depending on the hotmelt adhesive, the adhesive bond is reversible or irreversible. In the case of reactive or near-crosslinking hotmelt adhesives, the adhesive bond is not reversible as soon as the reaction or near-crosslinking has been initiated. With a reversible adhesive bond, the microcomponent can be detached again following heating above a specific temperature. Nevertheless, both reversible and irreversible adhesive bonding ensure an attachment of the microcomponent to the substrate with which the microcomponent no longer undergoes displacement, not even over tiny distances in the μm range.

Hotmelt adhesives are adhesives which melt on exposure to heat and, on solidifying, form the adhesive bond. Examples of customary hotmelt adhesives include mixtures of ethylene-vinyl acetate copolymers, polyamides or saturated polyesters with additives such as resins, plasticizers, stabilizers or fillers.

Reactive adhesives are to be seen in contradistinction to hotmelt adhesives, and set by chemical reaction. In this case, however, the aforementioned problem of potlife and setting time arises. Furthermore, incipiently dissolving adhesives are known which incipiently dissolve the surfaces to be bonded, so that the bond occurs after the macromolecules have undergone diffusion and the solvent has evaporated. Here too, the reaction time is too long. General-purpose adhesives likewise set by evaporation of solvent.

The reactive or nonreactive hotmelt adhesives are also to be seen in contradistinction to conventional pressure-sensitive adhesives, which, as permanent adhesives, commonly based on rubber, adhere under low pressure but tend to creep under permanent load. Also unsuitable are contact adhesives, which must be applied to both adherend surfaces, the bond in this case occurring, after preliminary drying, by means of brief, forceful compression.

Reactive or nonreactive hotmelt adhesives are distinguished, as physically setting adhesives, by the fact that application of adhesive to one side of the bond areas, and placement of the bond areas against one another, are sufficient to produce an adhesive bond, with heat being introduced before or after application. Curing takes place by cooling, and so the cure time can be made as short as desired, thereby preventing displacement of the microcomponents on the substrate in the course of bonding.

Hotmelt adhesives have the advantage, furthermore, that the adhesive bond is reversible, although it can also be made irreversible by means of an aftercure operation.

The hotmelt adhesives are applied preferably as granules of any desired form, preferably spherical.

The incipient melting of the selected bondsites can take place locally, by means for example of the focusing heat source of laser irradiation of the selected bondsites, or globally, by heating of the entire substrate or microcomponent by means, for example, of a hotplate or infrared radiation.

The hotmelt adhesive can also be applied by immersing a heated or unheated, patterned surface of the substrate or microcomponent in pulverulent hotmelt adhesive.

The pulverulent hotmelt adhesive can also be applied by means of a contoured screen or a mask.

A further possibility, however, is to charge the selected bondsites electrostatically and to apply the pulverulent hotmelt adhesive to the partly electrostatically charged surface of the substrate or microcomponent areally.

Likewise possible is the electrostatic charging of a roll from which pulverulent hotmelt adhesives are then transferred to the substrate or microcomponent.

Brief heating of the surface then produces incipient melting of the adhesive at the electrostatically charged bondsites. Subsequently the microcomponents can be placed, individually or simultaneously, on the substrate and adhered by heating of the assembly.

The hotmelt adhesive can also be applied by placing a transfer sheet with granular or pulverulent adhesive attaching thereto, or a sheet of the hotmelt adhesive itself, onto the adherend surface of the microcomponent or substrate. To select bondsites, the sheet is preferably contoured. It is also possible, however, for the sheet to be mechanically stamped onto the substrate or microcomponent, or to be locally heated at selected bondsites, in order to transfer the adhesive attaching to the sheet to the selected bondsites.

When at least one microcomponent has been adhered to the substrate it is preferred to carry out afterheating of the system component in order to effect an adhesive bond. This afterheating may take place selectively, by means of laser, for example, or globally.

The granules of the adhesives ought to have a diameter of less than 150 μm and to be situated preferably in the range from 0.5 to 150 μm. These granules may have any desired form, a sphere form for example.

The object is further achieved by the microsystem component, in which the adhesive bond between substrate and microcomponents is performed using hotmelt adhesive. These microcomponents are preferably smaller than 1000 μm.

DESCRIPTION OF THE FIGURES

The invention is illustrated below with reference to the attached drawings, in which.

DETAILED DESCRIPTION OF THE INVENTION

Figure 1:
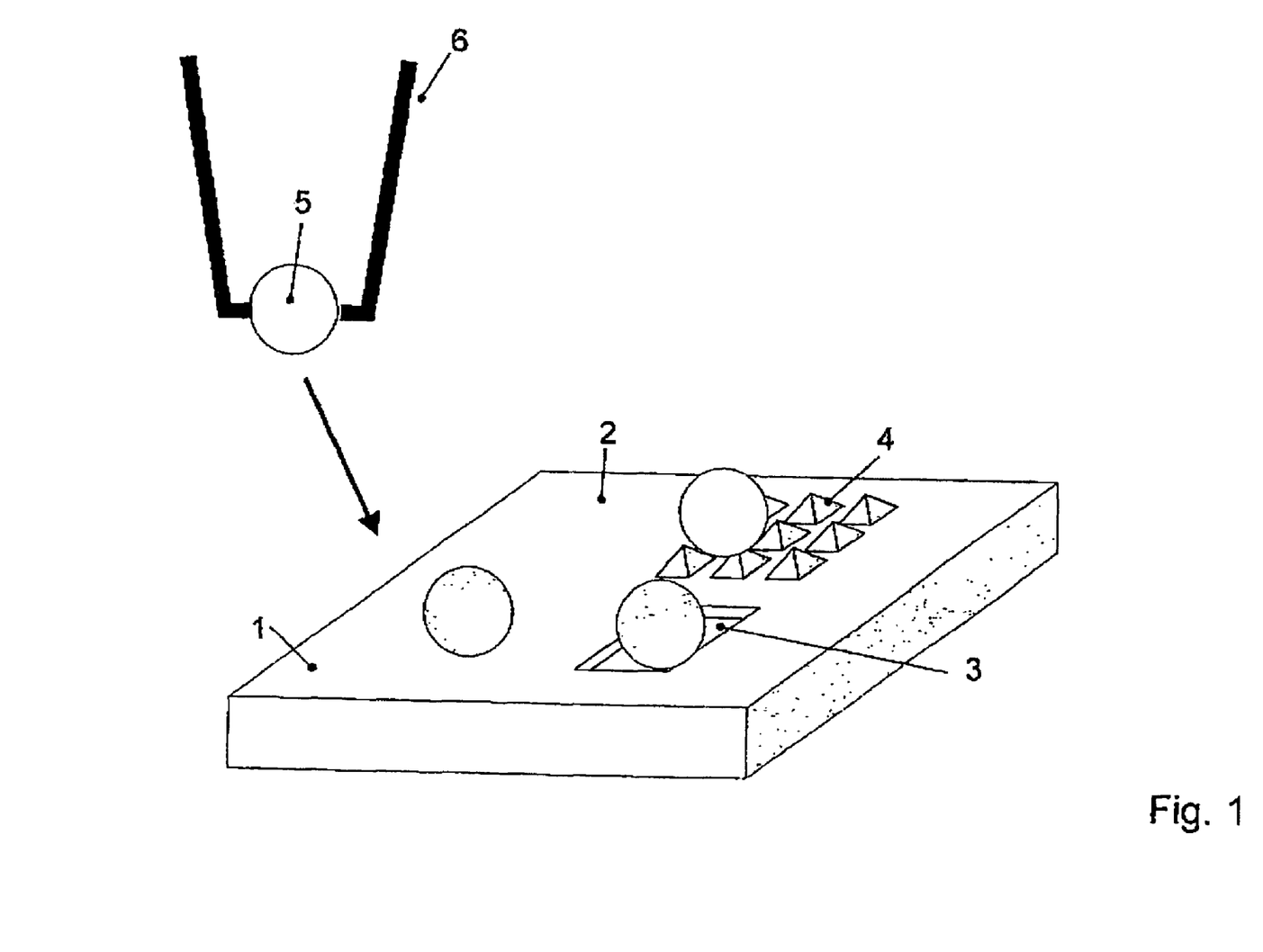
FIG. 1 shows an outline of the method of gluing microcomponents by application of a spherical hotmelt adhesive to a smooth or patterned surface.

FIG. 1 indicates an embodiment of the method for gluing microcomponents to a substrate 1. The substrate 1 has either a smooth surface 2 or a patterned surface with depressions 3 or elevations 4. The adhesive 5 is deposited individually and precisely on the bond areas, in the form of a granular reactive or nonreactive hotmelt adhesive, by means of a gripper 6. Particularly as a result of the patterned and/or heated surface, the granular adhesive 5 stays in its position. The form of the granules can be any desired form, examples being cuboidal, prism-shaped, spherical as depicted, or irregular.

When the adhesive 5 has been applied in this way, it is heated and at least one microcomponent is placed onto the bond areas of the substrate 1 that have been provided with adhesive 5. Heating may take place even during application, using a preheated gripper 6. The gripper 6 used may also be a needle for accepting and placing the adhesive granules. On cooling, an undisplaceable adhesive bond is produced immediately between microcomponent and substrate 1.

Figure 2:
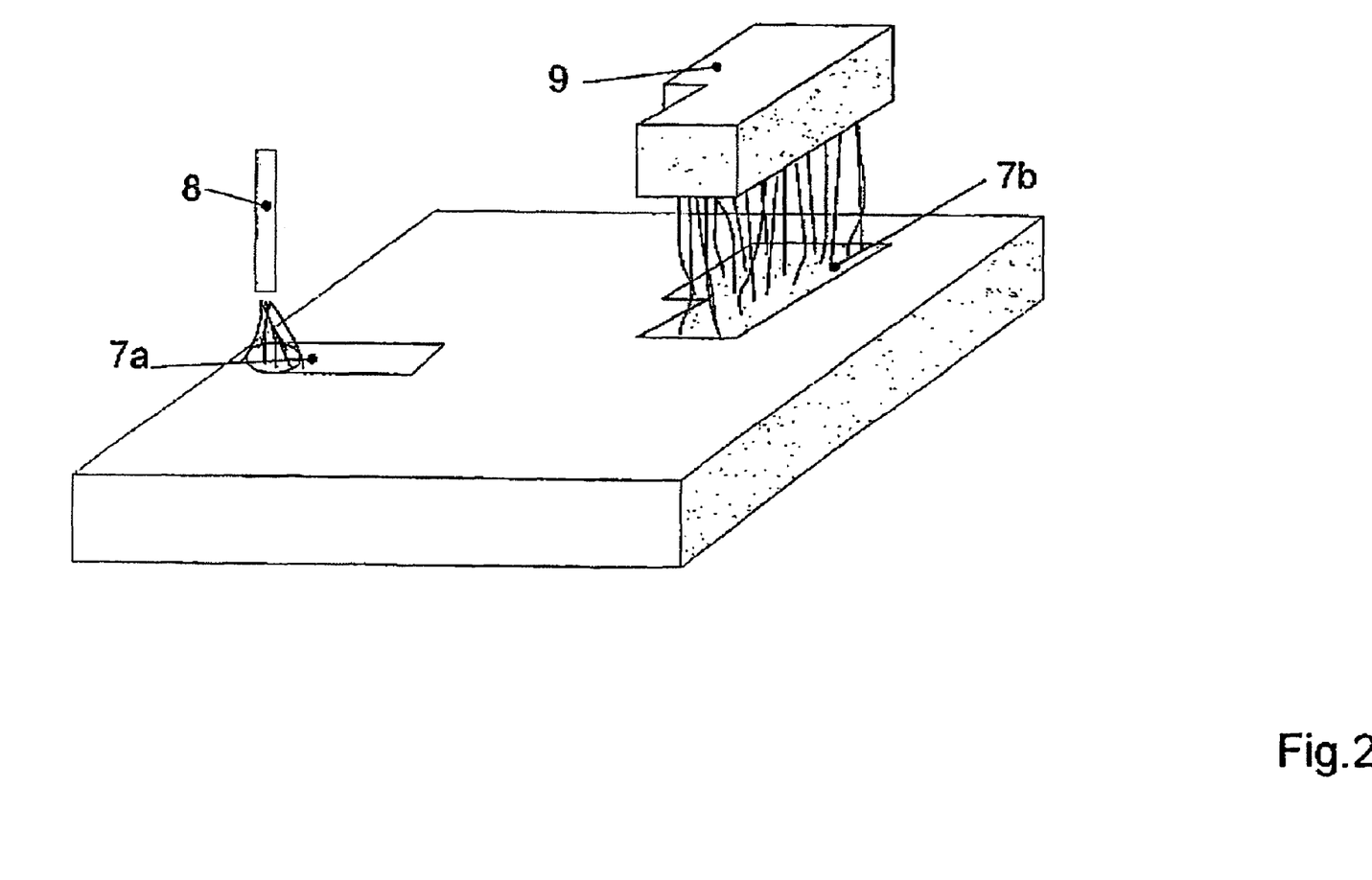
FIG. 2 shows an outline of the method for electrostatically charging a defined bond area.

FIG. 2 shows another embodiment of the method for applying adhesive 5 for producing microsystem components. In this case, selected bond areas 7a are electrostatically charged by means of an electrode 8. The electrode 8 is passed in this case over the areas 7a where bonding is to take place, so that these areas can be easily contoured in any desired form.

In another embodiment the electrostatic charging of the bond area 7b takes place using a mask or electrode 9 which is adapted geometrically to the form of the bond area 7b.

The adhesive 5 can then be placed individually with a gripper 6, or scattered on in powder form. The electrostatic precharged surface of the substrate 1 can also be immersed in pulverulent adhesive 5.

As already described above, the adhesive locally applied in this way is then heated and the at least one microcomponent is applied to the substrate 1.

Figure 3:
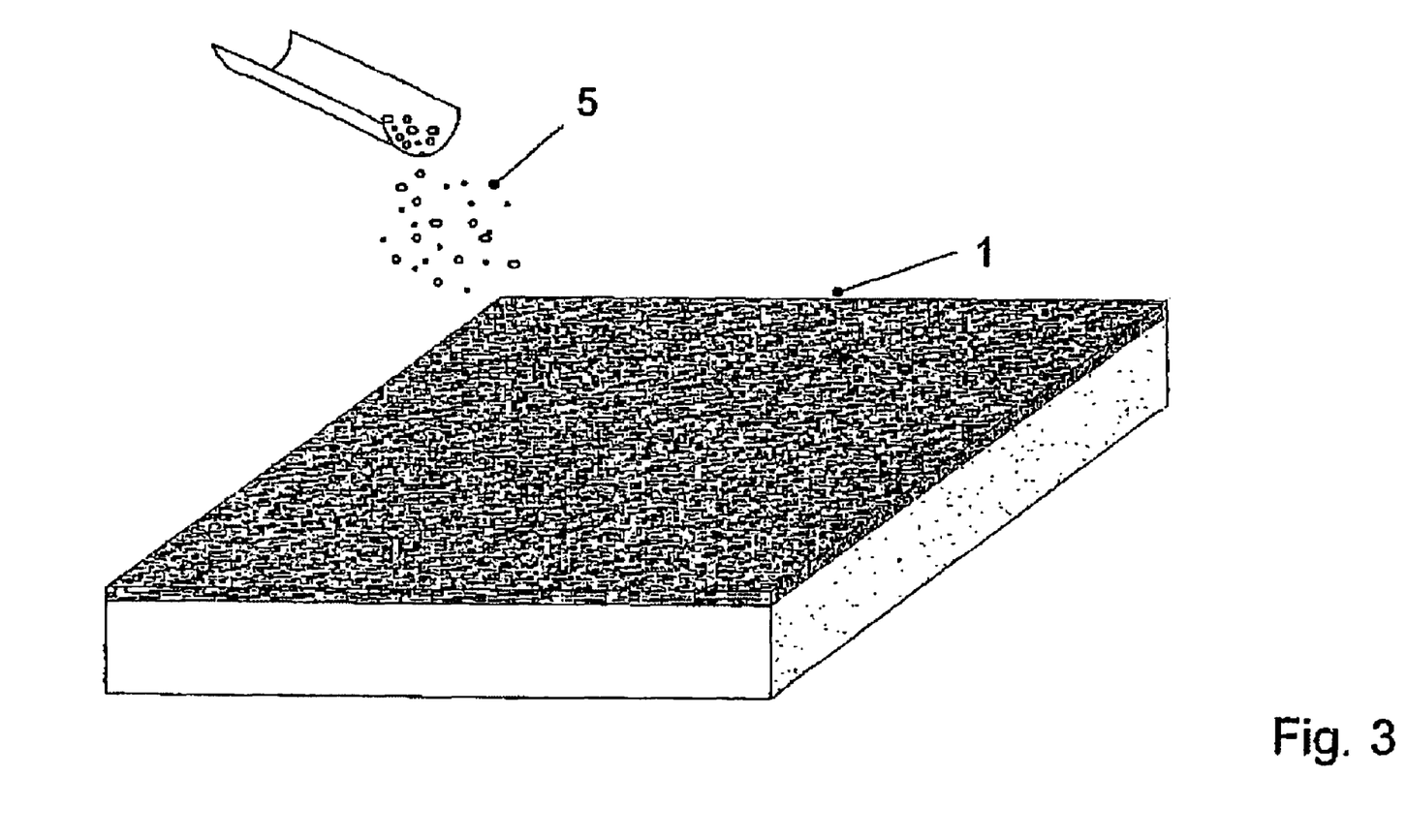
FIG. 3 shows an outline of the method for applying a pulverulent hotmelt adhesive extensively to the substrate surface.

FIG. 3 shows a method for applying a pulverulent adhesive 5 extensively to the surface of a substrate 1.

Figure 4:
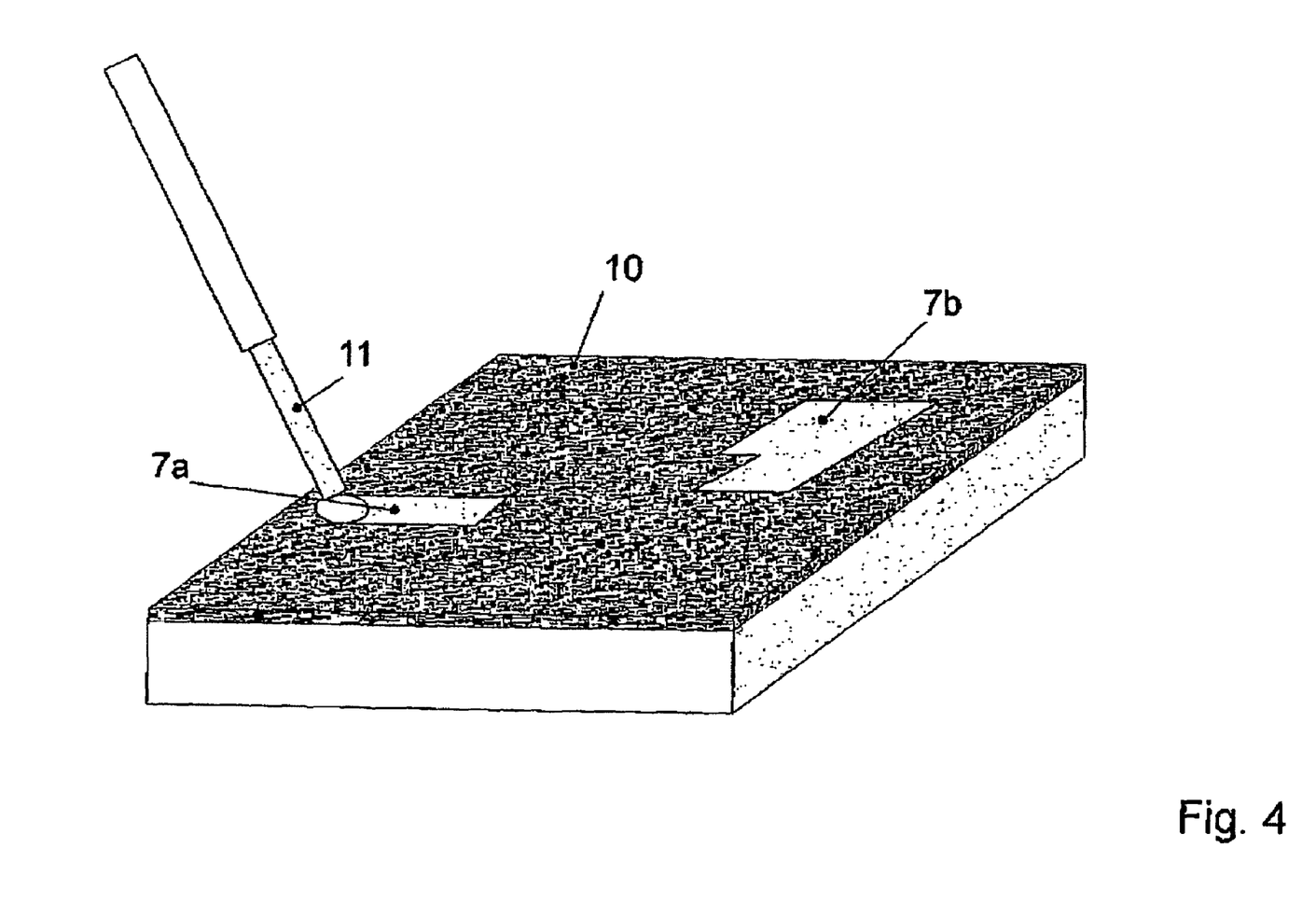
FIG. 4 shows an outline of a method for gluing microcomponents with extensive application of adhesive and incipient melting or sintering selected bond areas by means of a focused heat source.

In a subsequent step, which is outlined in FIG. 4, the pulverulent adhesive 5 is incipiently melted or sintered at the selected bond areas 7 by local heating with a focusable heat source, such as a laser beam, an infrared light beam, a UV light beam, etc., for example. Alternatively the bond areas can also be electrostatically charged beforehand, as shown in FIG. 2. The pulverulent adhesive 5 is then removed from those areas 10 of the substrate 1 where no bonding is to take place.

The incipient melting or sintering of selected bond areas 7 of the substrate 1 coated extensively, as outlined in FIG. 3, with pulverulent adhesive 5 can also be accomplished by masking off the areas 10 where no bonding is to take place, using a reflective mask, and extensively irradiating the surface of the substrate 1 with a heat source.

Figure 5:
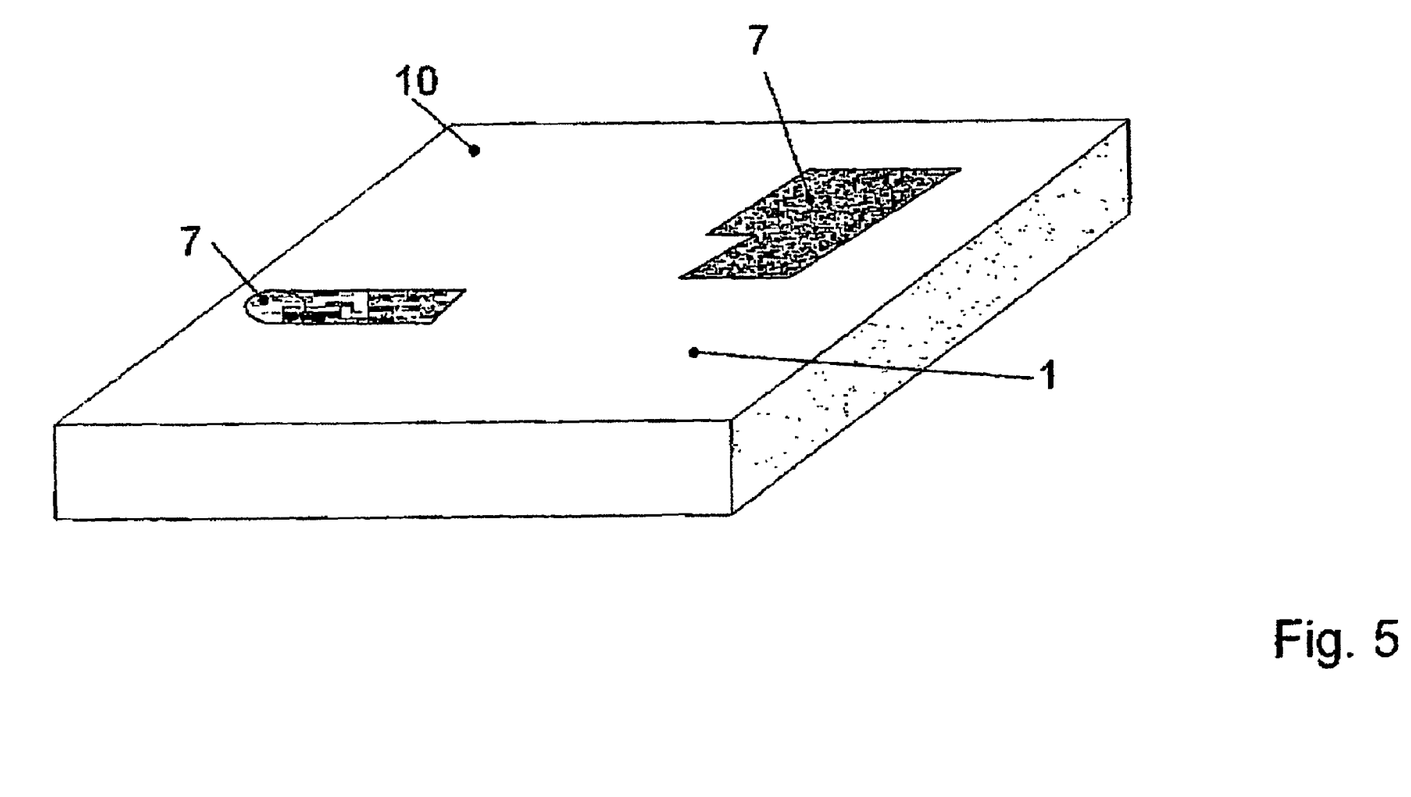
FIG. 5 shows an outline of the surface from FIG. 3 and FIG. 4 with adhesive remaining only at the bondsites as a result of electrostatic charging, incipient melting or incipient sintering.

As shown in FIG. 5, as a result of the incipient melting or sintering, the adhesive 5 remains attached at the selected bondsites 7 and can easily be removed from the areas 10 where no bonding is to take place.

Figure 6:
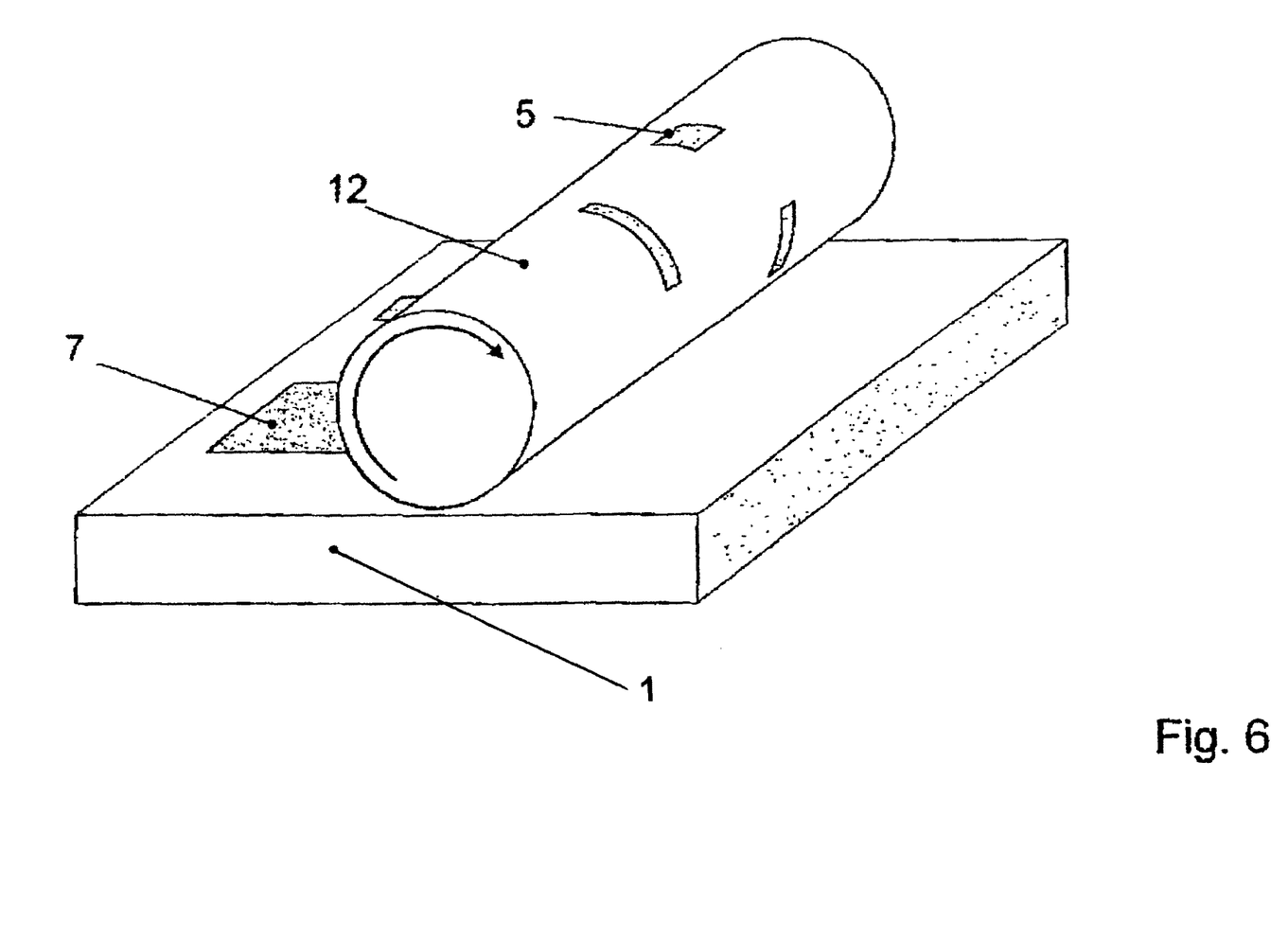
FIG. 6 shows an outline of a method for applying electrostatically charged pulverulent adhesive or dispersed hotmelt adhesive by means of a roll.

FIG. 6 shows another embodiment of the method for applying adhesive 5 in the form of an electrostatically charged pulverulent hotmelt adhesive or a hotmelt adhesive dispersion. In this case the adhesive 5 is applied to an electrostatically charged or contoured roll 12 which is moved relative to the surface of the substrate 1. By this means the adhesive 5, which attaches locally and in a targeted way to the surface of the roll 12, is transferred to the selected bond areas 7.

Figure 7:
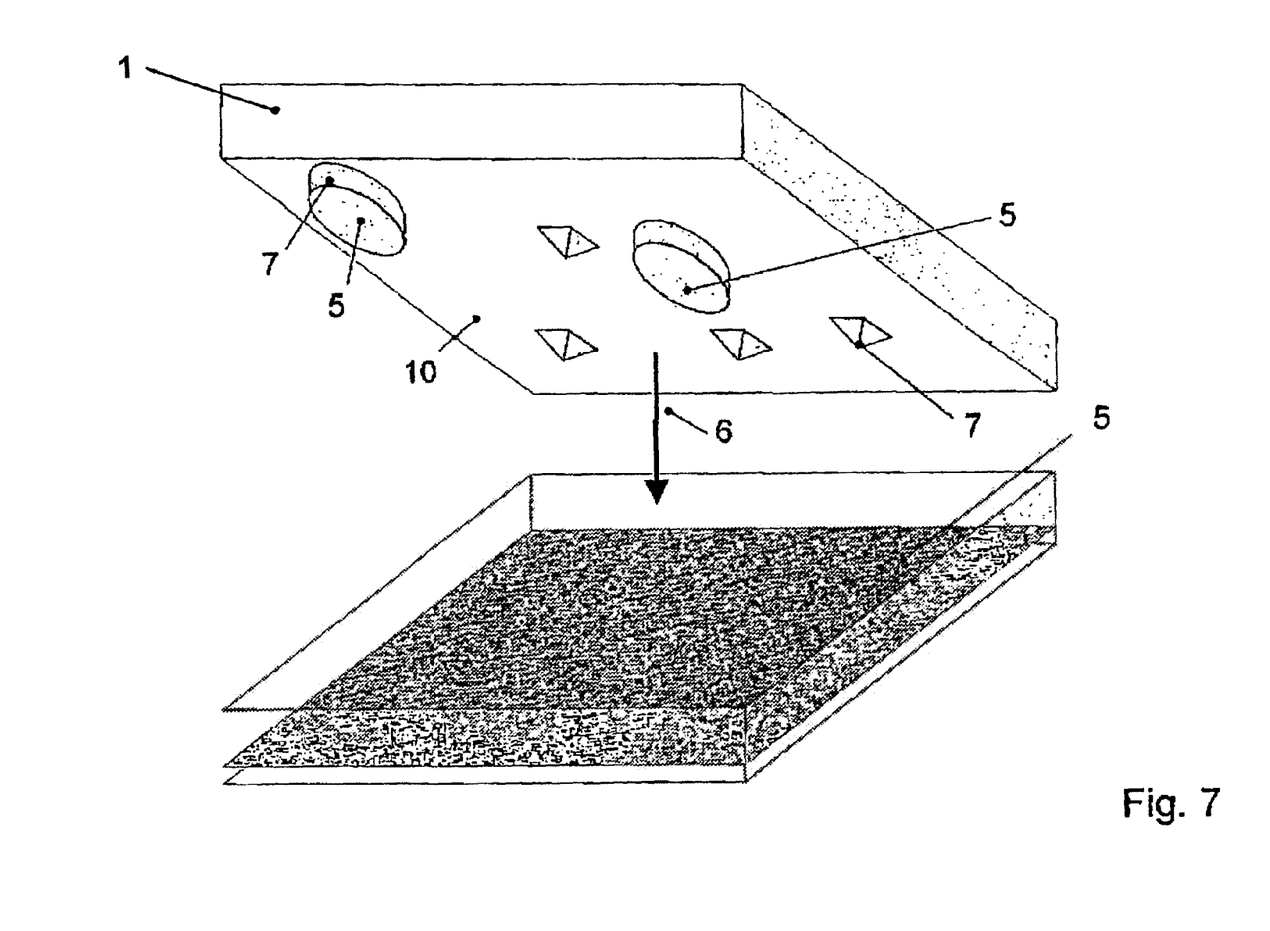
FIG. 7 shows an outline of a method for applying adhesive to selected bondsites by immersion of a raised pattern into pulverulent adhesive or a dispersion.

FIG. 7 shows another embodiment of the method for applying an adhesive 5 to selected bondsites of a substrate 1 or microcomponent. The substrate 1 or microcomponent has a raised pattern at the selected bond areas 7, and this pattern is immersed in pulverulent adhesive or a hotmelt adhesive dispersion. The raised bond areas 7 are thereby wetted with adhesive 5, and those areas 10 of the substrate 1 where no bonding is to take place remain uncoated.

Figure 8:
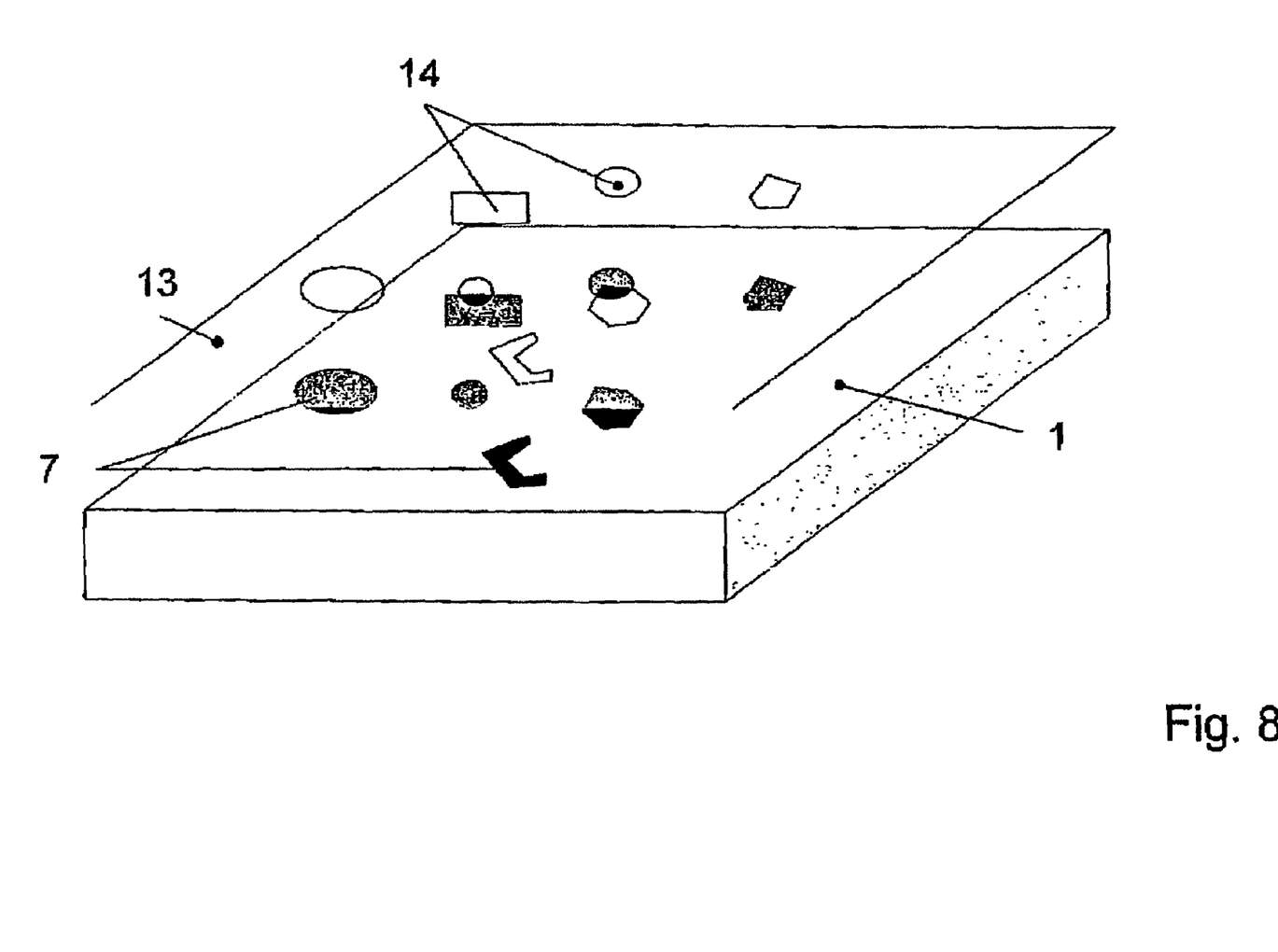
FIG. 8 shows an outline of a method for applying adhesive by means of screen printing.

FIG. 8 shows another embodiment for applying adhesive 5 in the form of a pulverulent hotmelt adhesive or a dispersion of such an adhesive 5. The adhesive 5 in this case is scattered through a contoured screen or applied in the form of a dispersion, by means of a screen printing technique, using a screen 13 that has screen openings 14 corresponding to the selected bond areas 7.

Figure 9:
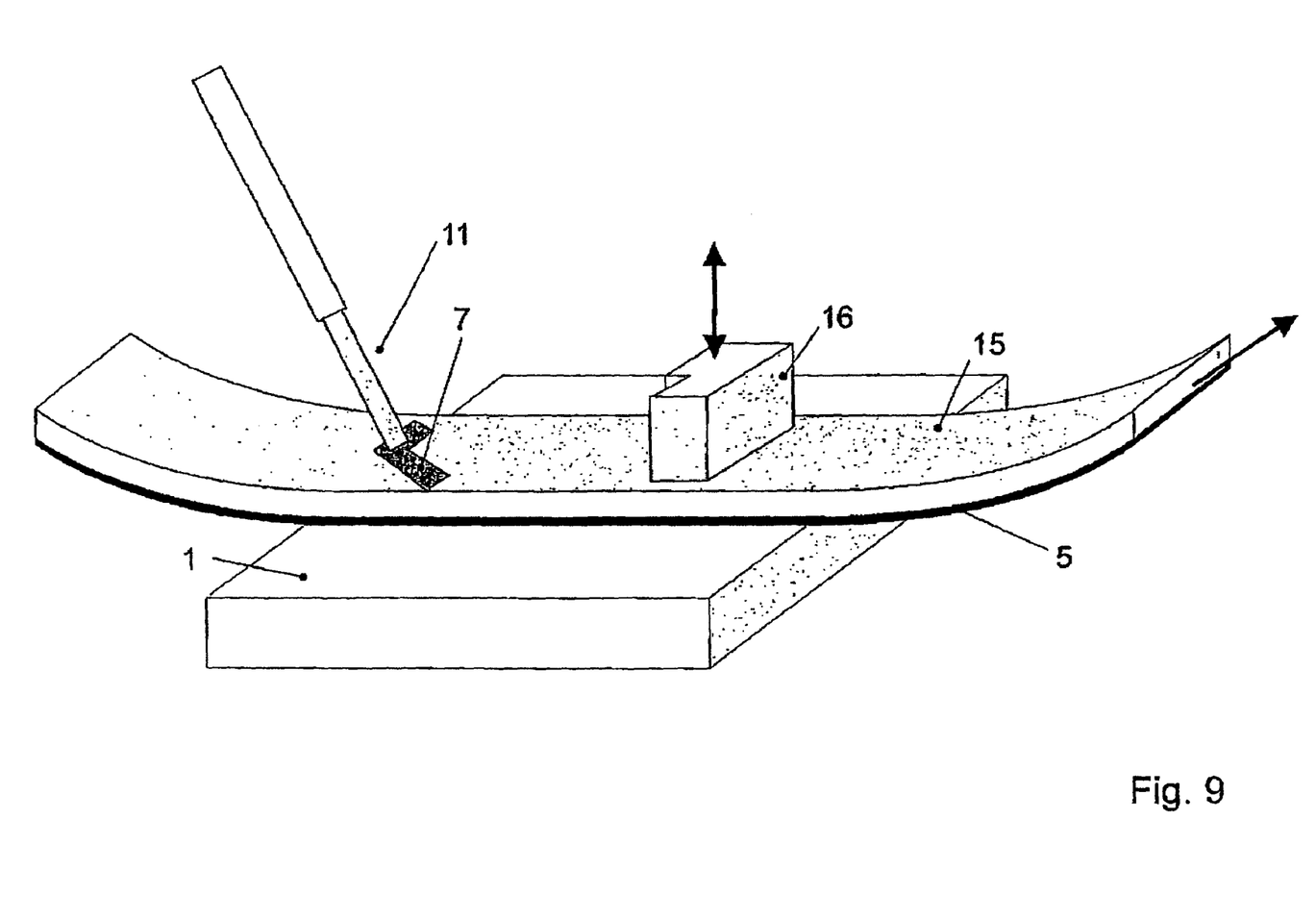
FIG. 9 shows an outline of a method for applying an adhesive by means of a transfer tape or of a sheet produced from hotmelt adhesive.
Figure 10:
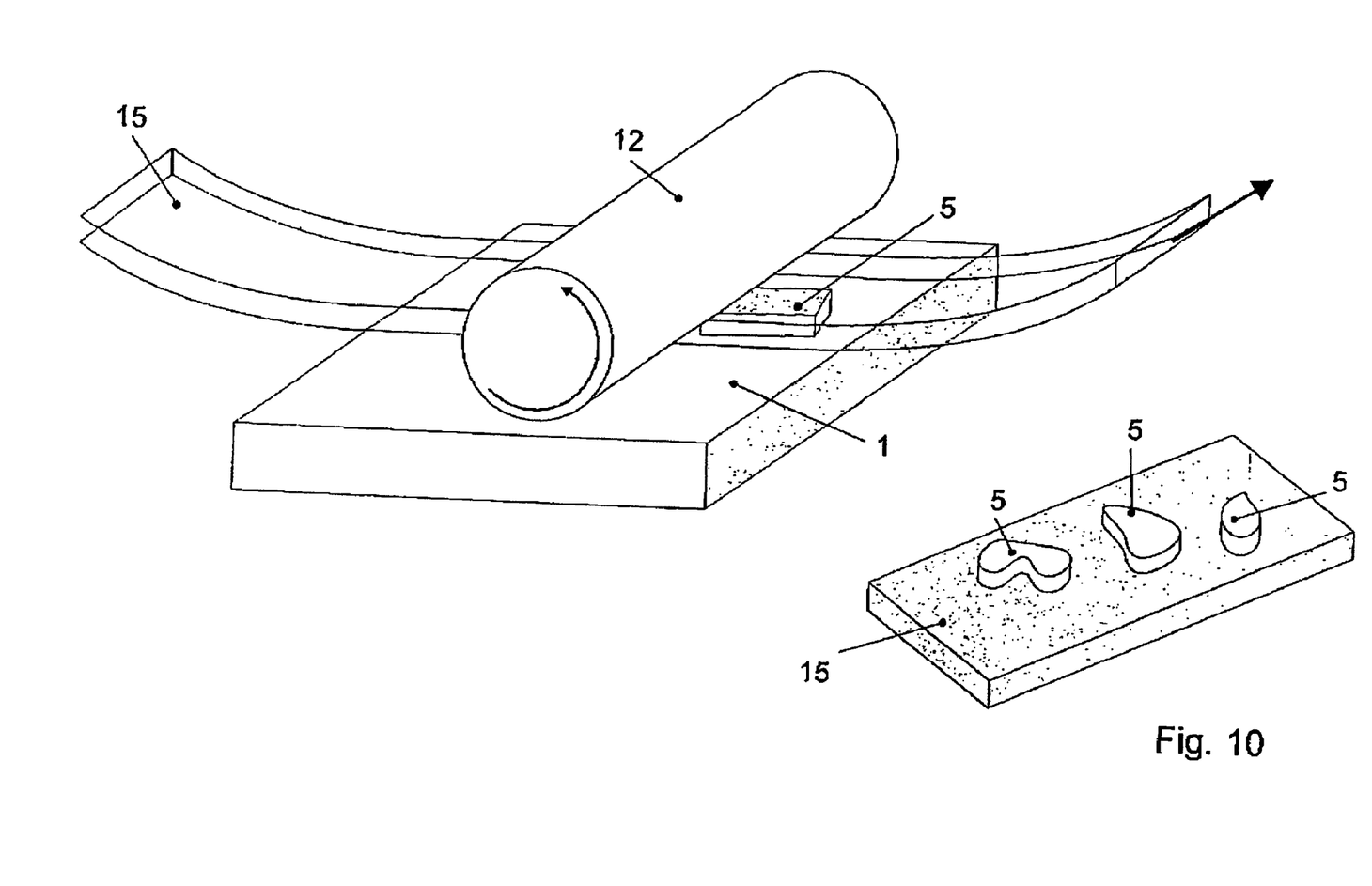
FIG. 10 shows an outline of a method for applying adhesive with a transfer tape for contoured hotmelt adhesives.
Figure 11:
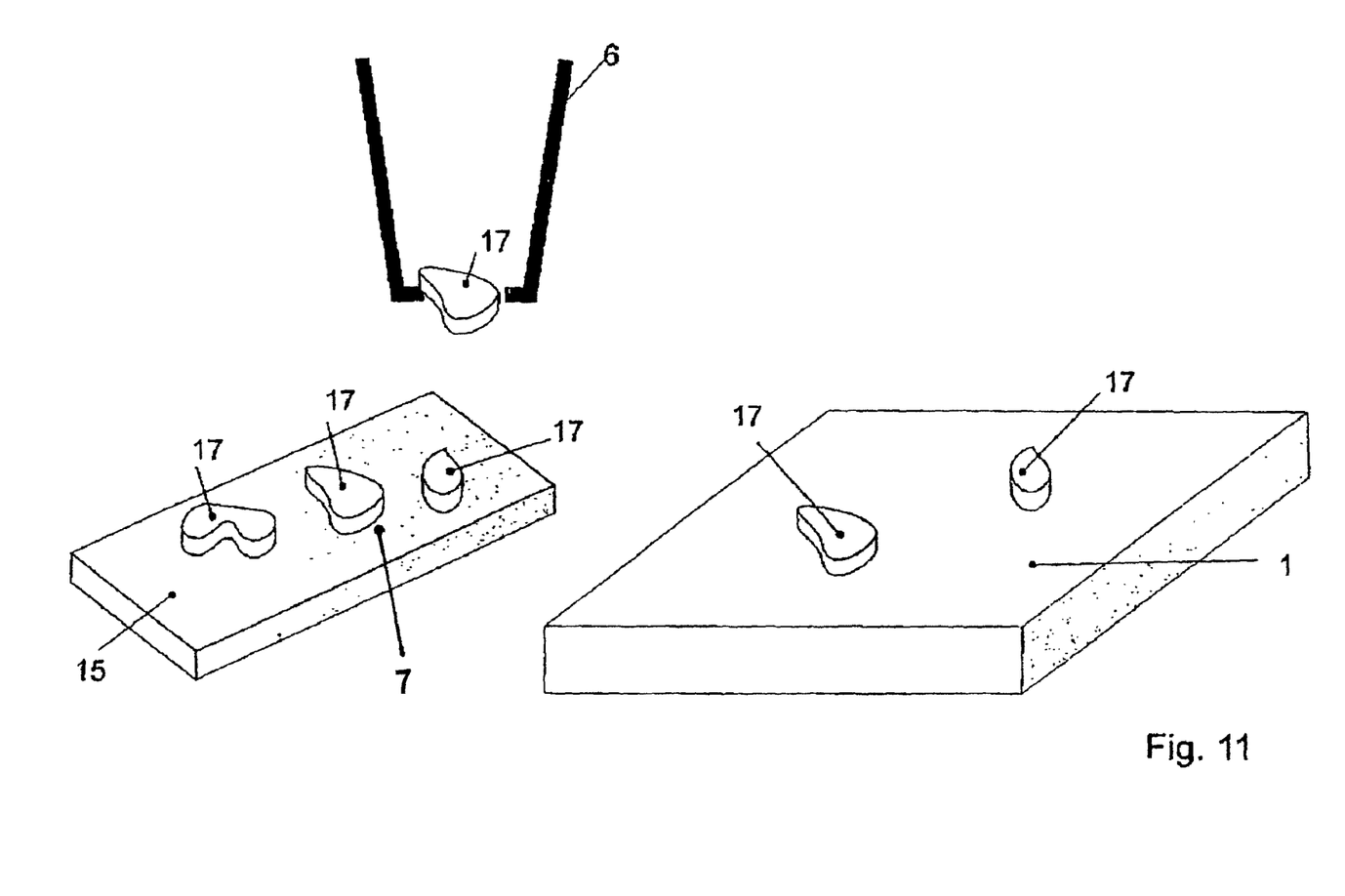
FIG. 11 shows an outline of the method for applying adhesive to a transfer sheet or a substrate, with contoured sections of adhesive being deposited onto the transfer sheet or the substrate.

FIGS. 9 to 11 show a different method of applying adhesive 5 to a substrate 1 or microcomponent by means of a transfer sheet 15. The transfer sheet 15 can be moved in a way similar to a typewriter ribbon over the surface of the substrate 1. The transfer sheet 15 carries the hotmelt adhesive 5 in the form of a relatively thin layer onto the surface which faces the substrate 1. By means of a focused heat source 11, a laser for example, the sheet is heated at selected sites, corresponding to the bond areas 7, and in this way the adhesive 5 is attached to the surface of the substrate 1 at the selected bondsites 7. Alternatively, a contoured die 16 can be used to press the adhesive 5 mechanically onto the surface of the substrate 1 at the selected bondsites 5. The sheet 15, which is like a transfer tape, is moved continuously or discontinuously relative to the surface of the substrate 1, as outlined by the arrow, so that complete areas of adhesive for application to the substrate 1 are always available.

FIG. 10 shows another embodiment of the application of adhesive 5 by means of a transfer sheet 15 to a substrate 1 and a microcomponent. In this case the adhesive 5 is already applied in corresponding contoured form to the transfer sheet 15 in the bond areas 7. The contouring can be accomplished by cutting out, by means of a laser or milling cutter, for example. The transfer sheet 15 with the contoured adhesive 5 is then placed on the surface of the substrate 1 and pressed on using a roll 12, so that the adhesive 5 remains attached to the surface of the substrate 1.

FIG. 11 shows another embodiment, in which a contoured adhesive sheet 17 is picked up with a gripper 6 and deposited in a targeted way on a transfer sheet 15. The transfer sheet 15 can then be applied to the substrate 1 in the manner shown in FIG. 10. Alternatively, as outlined in FIG. 11, the contoured adhesive sheet 17 can be deposited directly on the substrate 1 at the selected bond areas 7.

The gripper 6 may be a suction gripper, an electrostatically charged gripper, a mechanical gripper, a needle, etc.

The adhesive 5 may be applied not only to the surface of the substrate 1, as outlined, but instead, correspondingly, to the microcomponents, or both to the substrate 1 and to the microcomponents.

Figure 12:
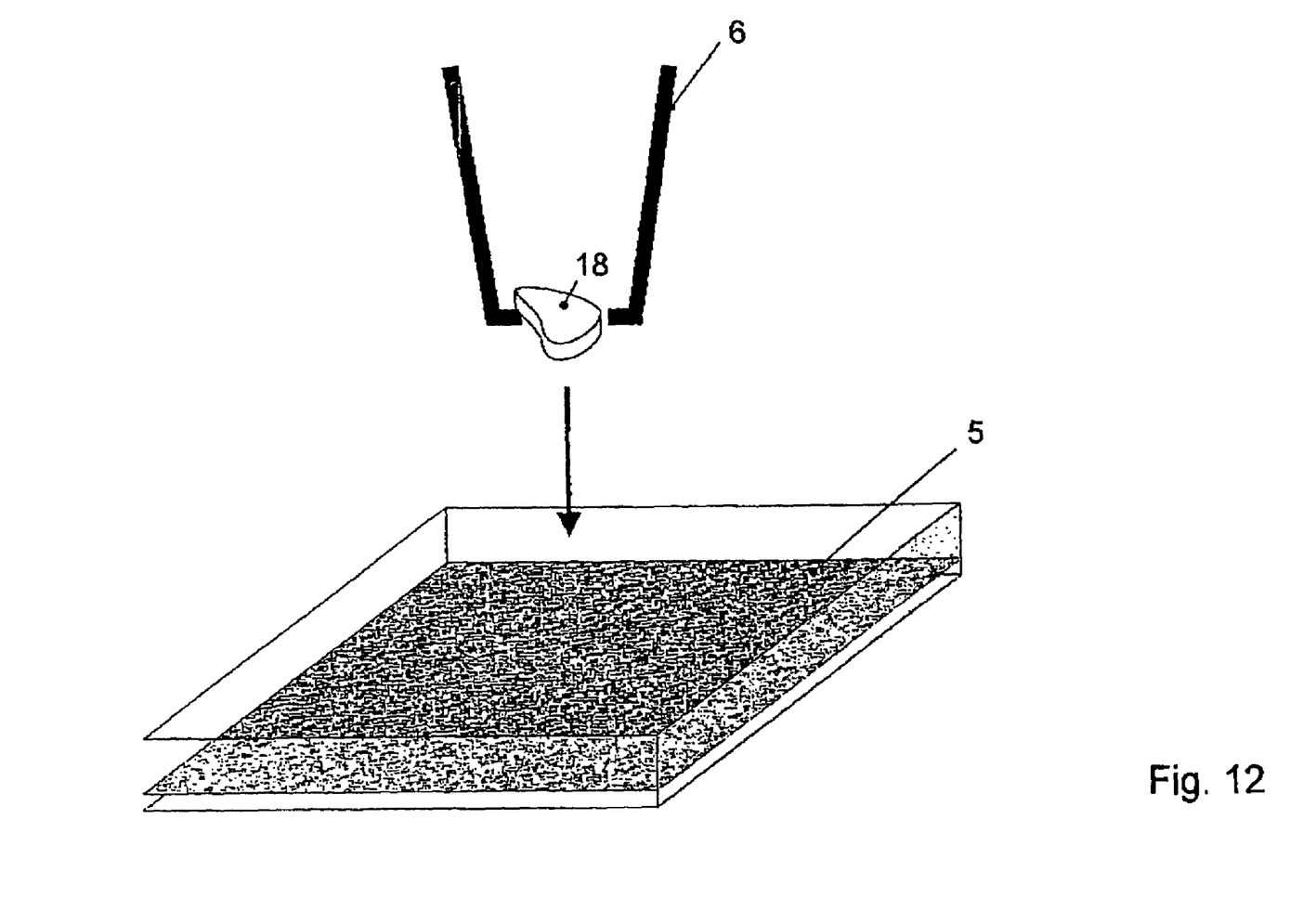
FIG. 12 shows an outline of the method for applying adhesive by immersion of a microcomponent in pulverulent hotmelt adhesive or a dispersion.

In this case, as outlined in FIG. 12, the microcomponent 18 can be gripped with a gripper 6 and immersed in a vessel containing a dispersion of a hotmelt adhesive or of a pulverulent hotmelt adhesive. It is advantageous in this case if the microcomponent 18 has been heated.

The invention claimed is:

1. A method for gluing microcomponents to a substrate in the production of microsystem components, comprising:
    applying a reactive or nonreactive, pulverulent, hotmelt adhesive as a dispersion through a contoured screen with a result that said hotmelt adhesive is present only selected contact areas on a surface of at least one of a substrate and at least one microcomponent, said hotmelt adhesive not being present on other areas on said surface of said at least one of a substrate and at least one microcomponent, said at least one microcomponent being smaller than 1000 µm, and granules of said reactive or nonreactive, pulverent, hotmelt adhesive having a diameter ranging from 0.5 to 150 µm; and
    applying the at least one microcomponent to the substrate by melting the hotmelt adhesive on the contact areas when the hotmelt adhesive is between the at least one microcomponent and the substrate, and bonding the at least one microcomponent to the substrate during cooling of the hotmelt adhesive below its melting point.

2. The method of claim 1 further comprising a step of afterheating the at least one microcomponent after adhering to the substrate.

3. The method of claim 2, wherein the afterheating takes place using a focused or global heat source.

4. The method of claim 1 wherein melting the hotmelt adhesive during the step of applying the at least microcomponent to the substrate is achieved using a laser as a heat source.

5. The method of claim 1 further comprising a step of preheating of the surface to which hotmelt adhesive is to be applied.

6. The method of claim 1 wherein said step of applying the at least one microcomponent to the substrate step includes the steps of:
    melting of said hotmelt adhesive at said selected contact areas on said surface by irradiating said reactive or nonreactive, pulverant, hotmelt adhesive on the selected contact areas using a focusable heat source; and
    removing the reactive or nonreactive, pulverant, hotmelt adhesive not incipiently melted.

* * * * *